(12) United States Patent
Chun et al.

(10) Patent No.: US 11,444,014 B2
(45) Date of Patent: Sep. 13, 2022

(54) SEMICONDUCTOR PACKAGES INCLUDING AN INSULATING LAYER INCLUDING A RECESSED SURFACE AND METHODS OF MANUFACTURING THE SAME

(71) Applicant: Samsung Electronics Co., Ltd., Suwon-si (KR)

(72) Inventors: Jinho Chun, Seoul (KR); Jin Ho An, Seoul (KR); Teahwa Jeong, Hwaseong-si (KR); Jeonggi Jin, Seoul (KR); Ju-Il Choi, Seongnam-si (KR); Atsushi Fujisaki, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 54 days.

(21) Appl. No.: 16/830,361

(22) Filed: Mar. 26, 2020

(65) Prior Publication Data

US 2021/0090984 A1 Mar. 25, 2021

(30) Foreign Application Priority Data

Sep. 19, 2019 (KR) .......................... 10-2019-0115311

(51) Int. Cl.
*H01L 23/49* (2006.01)
*H01L 23/498* (2006.01)
(Continued)

(52) U.S. Cl.
CPC .... *H01L 23/49838* (2013.01); *H01L 21/4857* (2013.01); *H01L 23/3121* (2013.01);
(Continued)

(58) Field of Classification Search
CPC .......... H01L 23/49838; H01L 21/4857; H01L 23/3121; H01L 23/49822; H01L 24/16;
(Continued)

(56) References Cited

U.S. PATENT DOCUMENTS 6,667,230 B2   12/2003   Chen et al.
8,563,416 B2   10/2013   Erwin et al.
(Continued)

FOREIGN PATENT DOCUMENTS

CN   101882587   11/2010
CN   104576587   4/2015
KR    0172773    3/1999

*Primary Examiner* — Lex H Malsawma
*Assistant Examiner* — Laura M Dykes
(74) *Attorney, Agent, or Firm* — Myers Bigel, P.A.

(57) ABSTRACT

There are provided semiconductor packages including a redistribution substrate and a semiconductor chip mounted on the redistribution substrate. The redistribution substrate may include a lower protective layer, a first conductive pattern disposed on the lower protective layer, a first insulating layer surrounding the first conductive pattern and disposed on the lower protective layer, and a second insulating layer disposed on the first insulating layer. The first insulating layer may include a first upper surface that includes a first flat portion extending parallel to an upper surface of the lower protective layer, and a first recess facing the lower protective layer and in contact with the first conductive pattern. The first recess may be directly connected to the first conductive pattern.

18 Claims, 15 Drawing Sheets

(51) Int. Cl.
*H01L 23/00* (2006.01)
*H01L 21/48* (2006.01)
*H01L 23/31* (2006.01)

(52) U.S. Cl.
CPC ........ *H01L 23/49822* (2013.01); *H01L 24/16* (2013.01); *H01L 2224/16227* (2013.01)

(58) Field of Classification Search
CPC ......... H01L 2224/16227; H01L 23/145; H01L 23/49816; H01L 23/49894; H01L 23/3128; H01L 23/525; H01L 23/13; H01L 23/485; H01L 33/36
USPC ....................................................... 257/668

See application file for complete search history.

(56) References Cited

U.S. PATENT DOCUMENTS

| | | | |
|---|---|---|---|
| 9,041,215 B2 | 5/2015 | Yu et al. | |
| 9,117,812 B2 | 8/2015 | Lee et al. | |
| 9,520,352 B2 | 12/2016 | Arisaka et al. | |
| 10,192,804 B2 | 1/2019 | Chen et al. | |
| 10,504,835 B1* | 12/2019 | Wang | H01L 24/09 |
| 2002/0180063 A1* | 12/2002 | Iwaki | H01L 23/66 |
| | | | 257/778 |
| 2003/0124768 A1* | 7/2003 | Hsu | H01L 24/10 |
| | | | 438/108 |
| 2008/0050905 A1 | 2/2008 | Uchida et al. | |
| 2008/0054461 A1 | 3/2008 | Lang et al. | |
| 2016/0066423 A1* | 3/2016 | Sakamoto | H01L 23/5385 |
| | | | 174/261 |
| 2017/0278809 A1* | 9/2017 | Huang | H01L 21/02071 |
| 2017/0359891 A1* | 12/2017 | Gozu | H05K 3/0026 |
| 2018/0374803 A1* | 12/2018 | Aoki | H01L 21/563 |
| 2019/0131277 A1 | 5/2019 | Yang et al. | |
| 2019/0139924 A1* | 5/2019 | Chen | H01L 24/20 |
| 2019/0363064 A1* | 11/2019 | Lu | H01L 21/4846 |

* cited by examiner

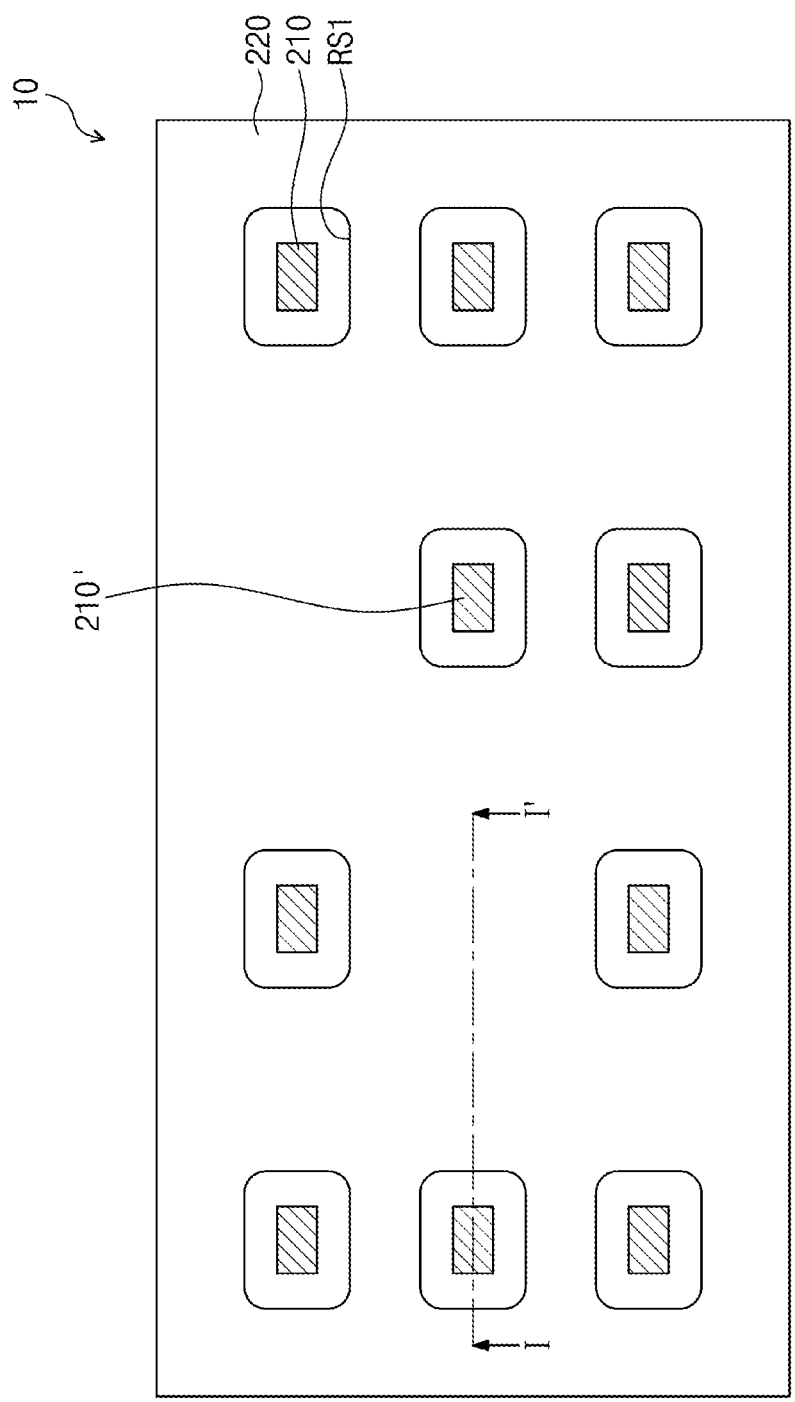

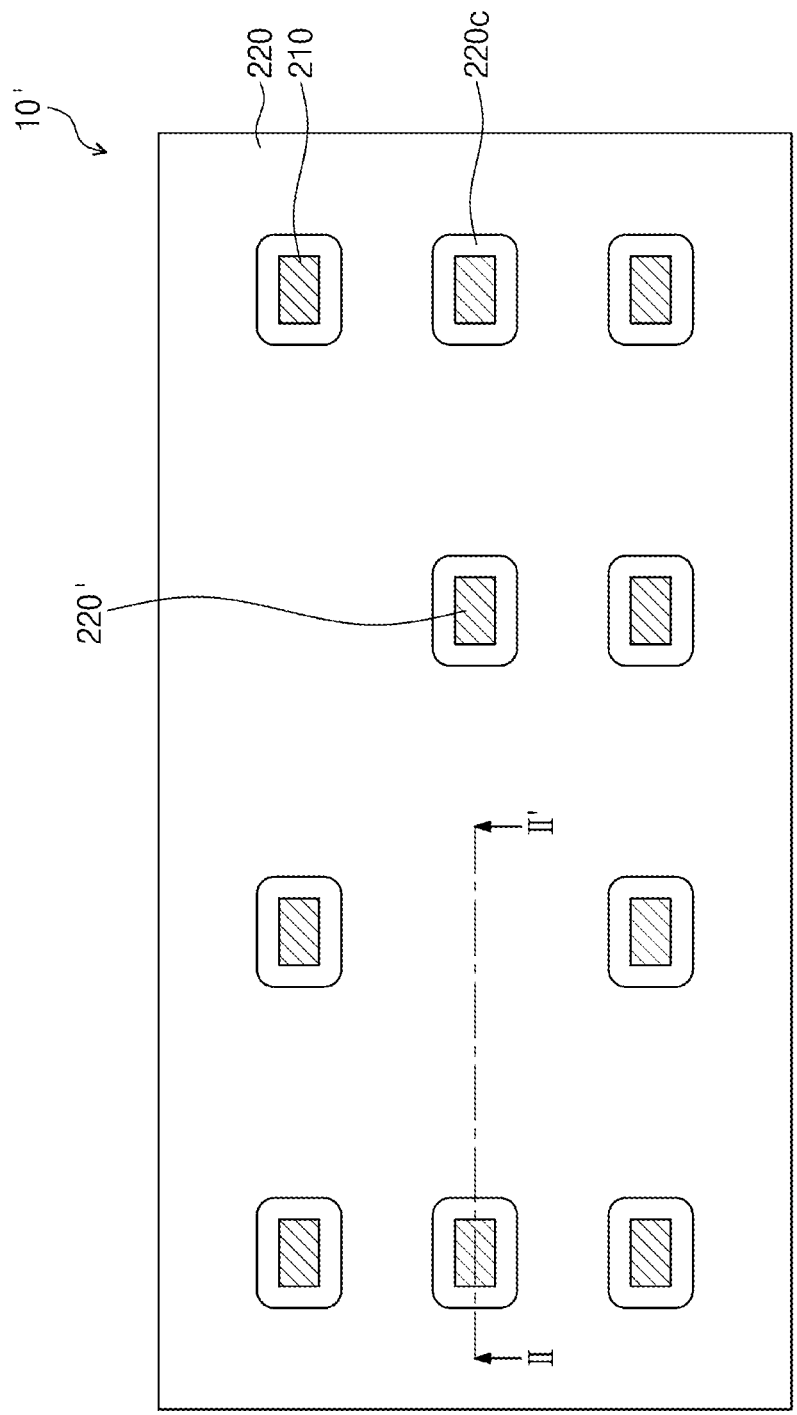

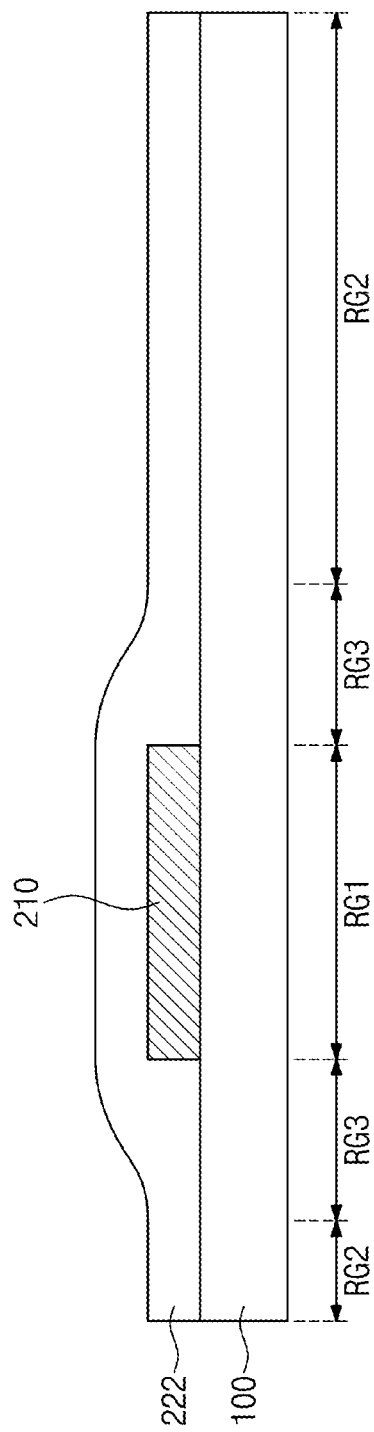

SEMICONDUCTOR PACKAGES INCLUDING AN INSULATING LAYER INCLUDING A RECESSED SURFACE AND METHODS OF MANUFACTURING THE SAME

CROSS-REFERENCE TO RELATED APPLICATION

This application claims priority under 35 USC § 119 to Korean Patent Application No. 10-2019-0115311, filed on Sep. 19, 2019, in the Korean Intellectual Property Office (KIPO), the contents of which are incorporated by reference herein in their entirety.

FIELD

The present disclosure relates to a semiconductor package.

BACKGROUND

A semiconductor package including an integrated circuit chip therein may be included in electronic devices. A semiconductor package may be manufactured by mounting semiconductor chips on a substrate such as a printed circuit board (PCB) and electrically connecting the semiconductor chips to each other using bonding wires or bumps.

With the development of the electronics industry, there is an increasing demand for high functional, high speed, and smaller electronic components. Accordingly, semiconductor devices or semiconductor packages with high-speed signal transmission, reduced size, and wiring redistribution have been developed.

SUMMARY

According to example embodiments of the present inventive concept, there are provided semiconductor packages including: a redistribution substrate, and a semiconductor chip mounted on the redistribution substrate. The redistribution substrate includes a lower protective layer, a first conductive pattern disposed on the lower protective layer, a first insulating layer surrounding the first conductive pattern and disposed on the lower protective layer, the first insulating layer including a first upper surface that include a first flat portion extending parallel to an upper surface of the lower protective layer and a first recess facing the lower protective layer and being directly connected with the first conductive pattern, and a second insulating layer disposed on the first insulating layer.

According to example embodiments of the present inventive concept, there are provided semiconductor packages including a lower protective layer, a first conductive pattern disposed on the lower protective layer, a first insulating layer contacting a side surface of the first conductive pattern on the lower protective layer, a second insulating layer covering or extending on the first insulating layer and the first conductive pattern, and a semiconductor chip disposed on the second insulating layer. The first insulating layer may include a first upper surface and an inclined surface adjacent to a side surface of the first conductive pattern, the first upper surface of the first insulating layer may extend parallel to the upper surface of the lower protective layer, and a distance from the upper surface of the lower protective layer to the inclined surface varies toward the first conductive pattern.

According to example embodiments of the present inventive concept, there are provided semiconductor packages including a redistribution substrate, a semiconductor chip mounted on the redistribution substrate, and a molding film covering or extending on a side surface of the semiconductor chip on the redistribution substrate. The redistribution substrate may include a lower protective layer, a first conductive pattern disposed on the lower protective layer, a first insulating layer surrounding the first conductive pattern on the lower protective layer, a second insulating layer covering the first insulating layer and the first conductive pattern, and a terminal pad disposed on the second insulating layer and to which the semiconductor chip is electrically connected and the first insulating layer includes an inclined surface, a first upper surface and a second upper surface sequentially positioned from the first conductive pattern, and the second upper surface is located at the same level as the upper surface of the first conductive pattern. The first upper surface is located at a lower level than the second upper surface, and a distance from the upper surface of the lower protective layer to the inclined surface varies from the first upper surface to the first conductive pattern.

BRIEF DESCRIPTION OF THE DRAWINGS

FIG. 2A illustrates a plan view of a redistribution substrate of a semiconductor package according to example embodiments of the present inventive concept.

FIG. 5A is a plan view illustrating a redistribution substrate of a semiconductor package according to example embodiments of the present inventive concept.

FIGS. 6 to 11 illustrate cross-sectional views illustrating a method of manufacturing a semiconductor package in accordance with example embodiments of the present inventive concept.

DETAILED DESCRIPTION

Figure 1:
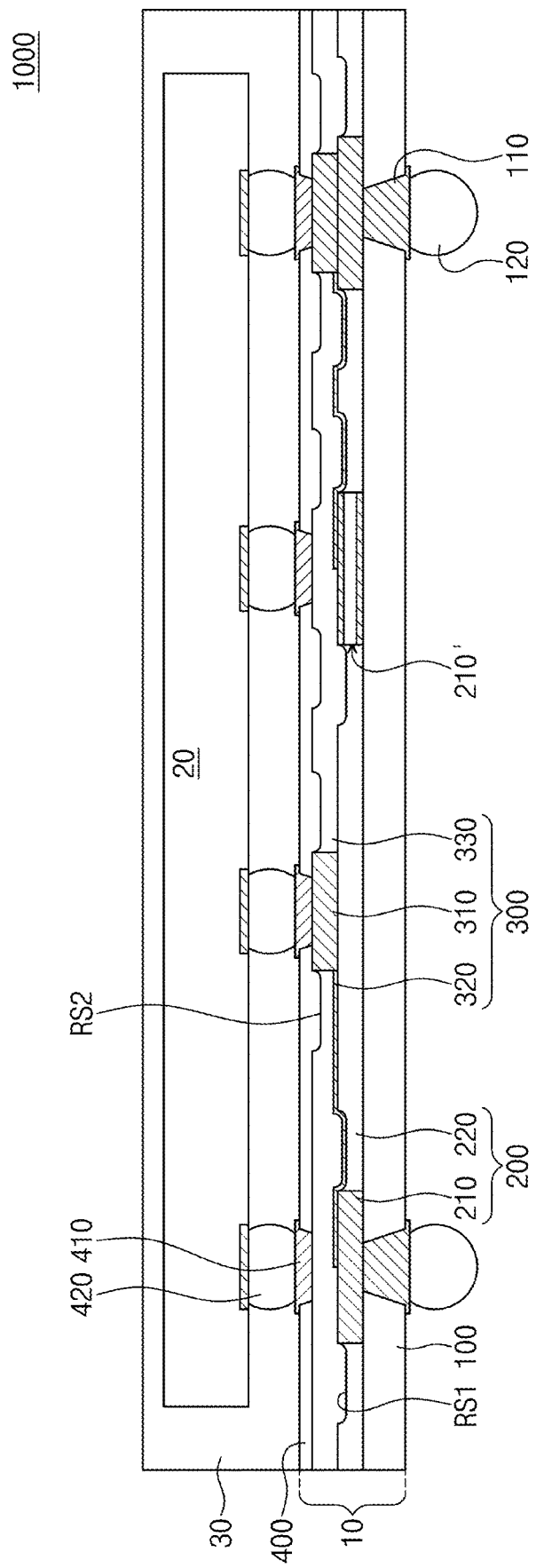
FIG. 1 is a cross-sectional view of a semiconductor package according to example embodiments of the present inventive concept.

Hereinafter, some example embodiments of the present inventive concept will be described in detail with reference to the accompanying drawings. The same reference numerals are used for the same constituent elements in the drawings, and duplicate description thereof may be omitted.

Figure 2B:
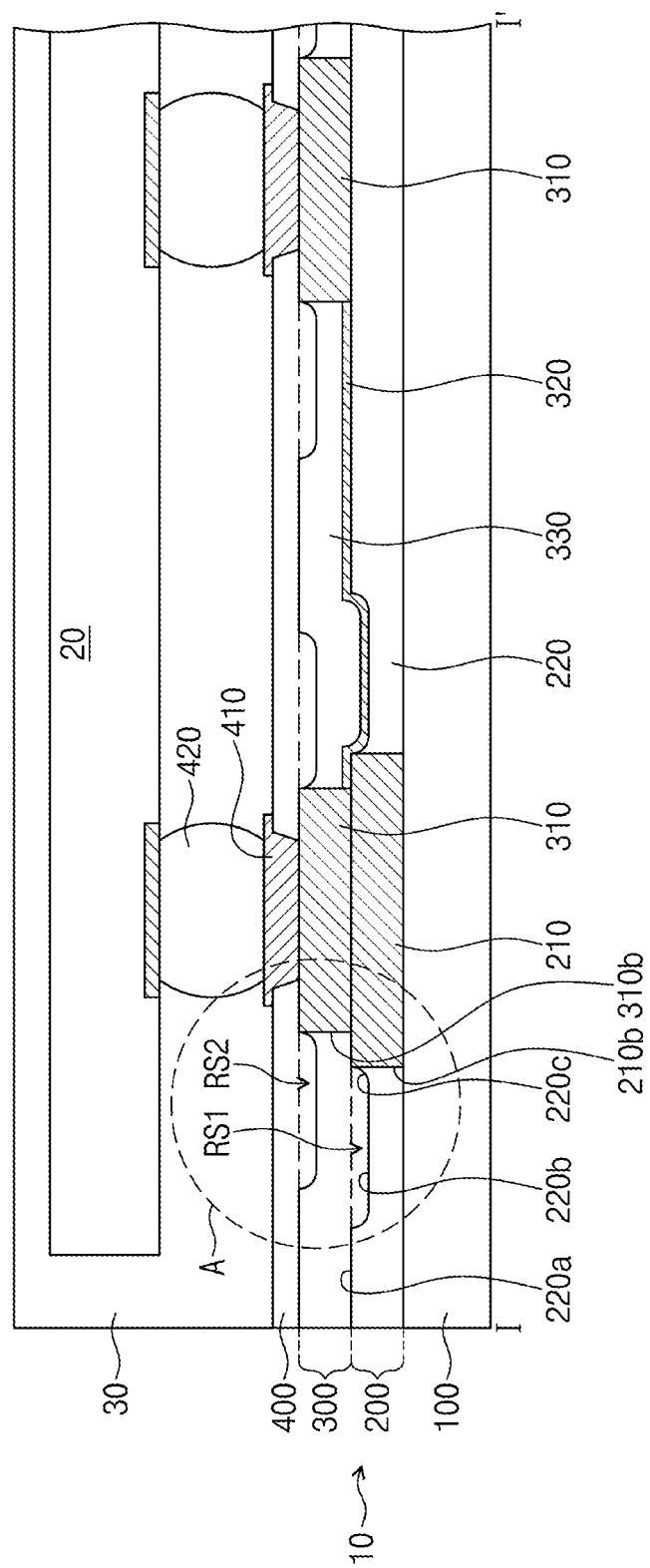
FIG. 2B illustrates a cross-sectional view of a redistribution substrate of a semiconductor package according to example embodiments of the present inventive concept.
Figure 3A:
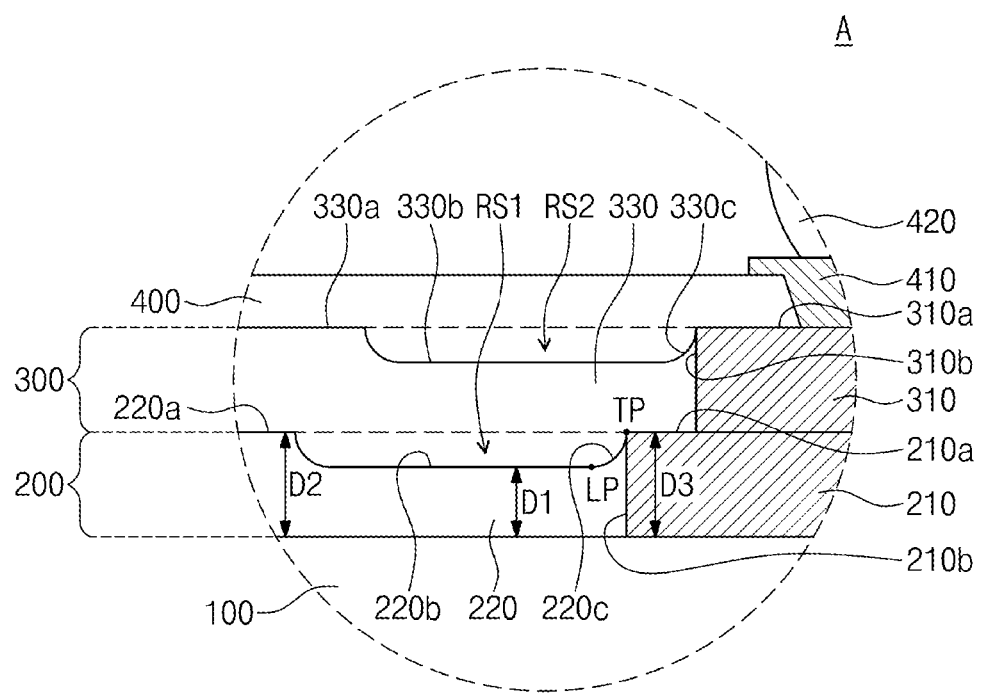
FIGS. 3A to 3C illustrate enlarged views of the region A of FIG. 2B.
Figure 3B:
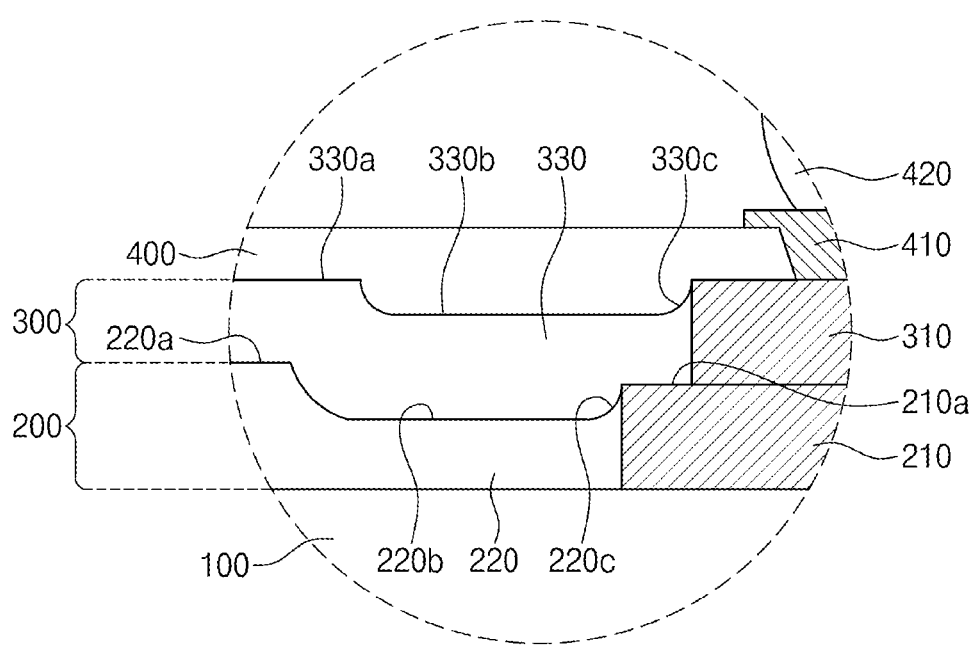
Figure 3C:
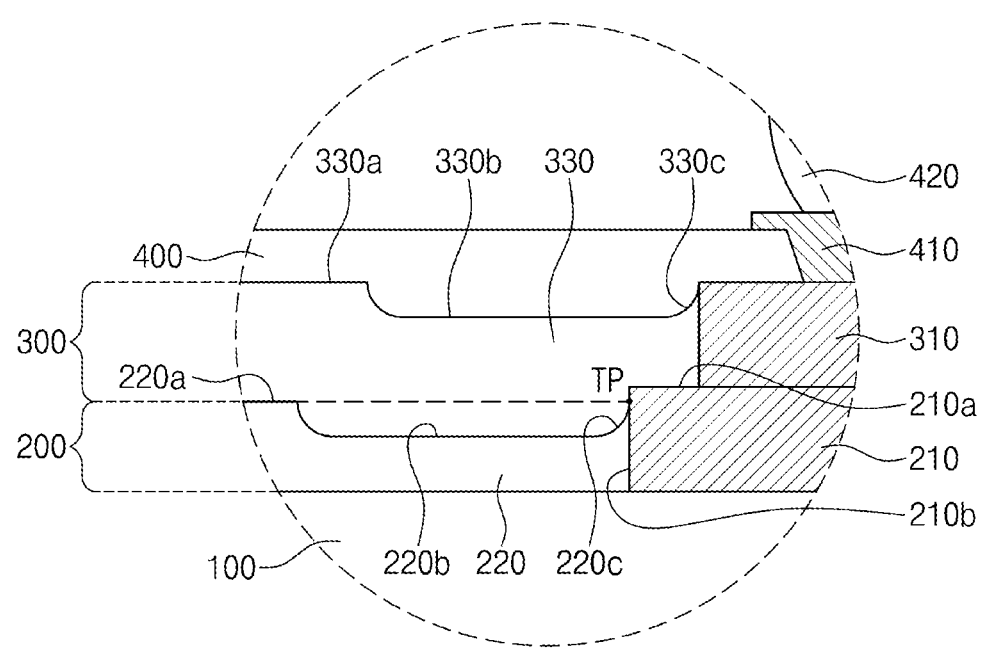

FIG. 1 illustrates a cross-sectional view of a semiconductor package according to example embodiments of the present inventive concept. FIG. 2A is a plan view illustrating a redistribution substrate of a semiconductor package according to example embodiments of the present inventive concept. FIG. 2A schematically illustrates a redistribution substrate of the semiconductor package of FIG. 1 and may not show some components for convenience of description. FIG. 2B illustrates a cross-sectional view of a redistribution substrate of a semiconductor package according to example embodiments of the present inventive concept and corresponds to a cross section taken along the line I-I' of FIG. 2A. FIGS. 3A to 3C illustrate enlarged views of the region A of FIG. 2B.

Referring to FIGS. 1, 2A and 2B, a semiconductor package 1000 may include a redistribution substrate 10, a semiconductor chip 20, and a molding layer 30.

The redistribution substrate 10 may include a lower protective layer 100 and first and second wiring layers 200 and 300 stacked on the lower protective layer 100.

The lower protective layer 100 may protect and support the wiring layers 200 and 300. The lower protective layer 100 may include a silicon substrate and/or an insulating substrate. For example, the lower protective layer 100 may include inorganic materials such as silicon oxide (SiOx), silicon nitride (SiNx), silicon oxynitride (SiON) and/or polyamide-based polymer materials, but the lower protective layer 100 is not limited to thereto. The lower protective layer 100 may be omitted. As used herein the term "and/or" includes any and all combinations of one or more of the associated listed items.

The first wiring layer 200 may be disposed on the lower protective layer 100. The first wiring layer 200 may include a first conductive pattern 210 and a first insulating layer 220.

The first conductive pattern 210 may be disposed on the lower protective layer 100. The first conductive pattern 210 may include various components constituting an electric circuit in the first wiring layer 200. For example, the first conductive pattern 210 may be a conductive pad to which an external terminal or conductive via is connected. In FIG. 2B, the first conductive pattern 210 is illustrated as the conductive pad, but the present inventive concept is not limited thereto. For example, the first conductive pattern 210 may include conductive vias that electrically connect the upper and lower wiring layers, conductive wirings extending in a direction parallel to the upper surface of the protective layer to form an electrical circuit, or a conductive pad having a width wider than the conductive vias or the conductive wirings. The conductive via, the conductive wiring, an external solder ball and the like may be connected to the conductive pad.

As used herein, "being electrically connected" (or similar language) may mean "being directly or indirectly electrically connected." The first conductive pattern 210 may include a conductive material. For example, the first conductive pattern 210 may include copper (Cu), a copper alloy, and/or aluminum (Al).

The first conductive pattern 210 may be provided in plural. As illustrated in FIGS. 1 and 2A, the first conductive patterns 210 may be disposed on the lower protective layer 100, and may be horizontally spaced apart from each other. In this case, the distance between the first conductive patterns 210 may be greater than the width of the first recess RS1 of the first insulating layer 220 which will be described later. One of the first conductive patterns 210 may include a conductive pad, and another one of the first conductive patterns 210' may include a passive element.

For example, the passive element may be a capacitor as shown in FIG. 1. In some embodiments, the passive element may include various passive elements such as a resistance element. In some embodiments, the first conductive patterns 210 may include both conductive pads and passive elements or include only conductive pads or passive elements.

The first insulating layer 220 may be disposed on the lower protective layer 100. The first insulating layer 220 may surround the first conductive pattern 210 in a plan view. The first insulating layer 220 may contact the side surface 210b of the first conductive pattern 210. The first insulating layer 220 may include an insulating material. For example, the first insulating layer 220 may include a dry film resist (DFR) and/or a photo imagable dielectric (PID). The upper surfaces of the first insulating layer 220 may include a first upper surface 220a surrounding the first conductive pattern 210, a second upper surface 220b positioned between the first conductive pattern 210 and the first upper surface 220a, and a first inclined surface 220c facing the side surface 210b of the first conductive pattern 210 from the second upper surface 220b. That is, the second upper surface 220b may be positioned inside the first upper surface 220a in a plan view, and may surround the first conductive pattern 210. In addition, the first inclined surface 220c may be positioned inside the second upper surface 220b in a plan view, and may surround the first conductive pattern 210.

The first upper surface 220a may be substantially flat. The first upper surface 220a may be parallel to the upper surface of the lower protective layer 100. As shown in FIG. 3A, the first upper surface 220a may be positioned at the same level as the upper surface 210a of the first conductive pattern 210. The first upper surface 220a may be coplanar with the upper surface 210a of the first conductive pattern 210 as illustrated in FIG. 3A. In some embodiments, the first upper surface 220a may be located at a level higher than the upper surface 210a of the first conductive pattern 210 as shown in FIG. 3B. A distance between the first upper surface 220a and the lower protective layer 100 may be longer than a distance between the upper surface 210a of the first conductive pattern 210 and the lower protective layer 100 as illustrated in FIG. 3B. In some embodiments, the first upper surface 220a may be located at a level lower than the upper surface of the first conductive pattern 210 as shown in FIG. 3C. A distance between the first upper surface 220a and the lower protective layer 100 may be shorter than a distance between the upper surface 210a of the first conductive pattern 210 and the lower protective layer 100 as illustrated in FIG. 3B. In some embodiments The second upper surface 220b may be located at a lower level than the first upper surface 220a. A distance between the second upper surface 220b and the lower protective layer 100 may be shorter than a distance between the first upper surface 220a and the lower protective layer 100 as illustrated in FIGS. 3A, 3B, and 3C. "A distance between an element A and an element B" (or similar language) may refer to a shortest distance between the element A and the element B.

For example, the first insulating layer 220 may include a first recess RS1 recessed toward the lower protective layer 100. The lowest (i.e., lowermost) point LP of the first recess RS1 may be lower than the first upper surface 220a. The first recess RS1 may be located between the first conductive pattern 210 and the first upper surface 220a of the first insulating layer 220. For example, as shown in FIG. 2A, the first recess RS1 may be formed in a portion of the first insulating layer 220 adjacent to the first conductive pattern 210 in a plan view, and the first recess RS1 may surround the first conductive pattern 210. That is, the first recess RS1 may separate the first conductive pattern 210 from the first upper surface 220a of the first insulating layer 220.

The bottom surface of the first recess RS1 may be the same component as the second upper surface 220b, and the same reference numerals may be used herein. In some embodiments, the second upper surface 220b may define the bottom surface of the first recess RS1. The distance from the upper surface of the lower protective layer 100 to the bottom surface 220b of the first recess RS1 may be, for example, 0.5 to 1 times the distance from the upper surface of the lower protective layer 100 to the first upper surface 220a. In some embodiments, the distance from the upper surface of the lower protective layer 100 to the lower surface 220b of the first recess RS1 is 0.7 to 0.9 times the distance from the upper surface of the lower protective layer 100 to the first upper surface 220a, as shown in FIG. 3A.

The first inclined surface 220c may extend from one end of the second upper surface 220b to the side surface 210b of the first conductive pattern 210. The first inclined surface 220c may be inclined with the second upper surface 220b. According to FIG. 3A, the first inclined surface 220c may be the first side of the first recess RS1 which extends from the bottom surface 220b of the first recess RS1 toward the side surface 210b of the first conductive pattern 210. The first inclined surface 220c may define the first side of the first recess RS1. Herein, the first side of the first recess RS1 adjacent to the first conductive pattern 210 may be the same component as the first inclined surface 220c, and thus the same reference numeral may be used.

The first side surface 220c of the first recess RS1 may be inclined with both the side surface 210b of the first conductive pattern 210 and the first upper surface 220a of the first insulating layer 220. The distance between the first side surface 220c and the lower protective layer 100 may increase from the second upper surface 220b toward the first conductive pattern 210. In some embodiments, the distance between the first side surface 220c and the lower protective layer 100 may increase as a distance from the second upper surface 220b increases as illustrated in FIGS. 3A through 3C.

In detail, the first distance D1 between the lowest point LP of the first side surface 220c of the first recess RS1 and the lower protective layer 100 may be shorter than the second distance D2 between the first upper surface 220a and the lower protective layer 100. That is, the first inclined surface 220c may be a surface extending in a diagonally upward direction from the second upper surface 220b corresponding to the bottom surface 220b of the first recess RS1. The first distance D1 may be equal to the distance between the second upper surface 220b and the lower protective layer 100. The third distance D3 between the uppermost point TP of the first side surface 220c of the first recess RS1 and the lower protective layer 100 may be equal to the second distance D2 between the first upper surface 220a of the first insulating layer 220 and the lower protective layer 100. That is, the uppermost point TP of the first side surface 220c of the first recess RS1 may be located at the same level as the upper surface 210a of the first conductive pattern 210. The uppermost point TP of the first side surface 220c may be the uppermost point of the first side surface 220c.

In some embodiments, the uppermost point TP of the first side surface 220c of the first recess RS1 may be located at a level lower than the upper surface 210a of the first conductive pattern 210, as illustrated in FIG. 3C. That is, a distance between the uppermost point TP of the first side surface 220c of the first recess RS1 and the lower protective layer 100 may be shorter than the distance between the upper surface 210a of the first conductive pattern 210 and the lower protective layer 100.

Figure 4:
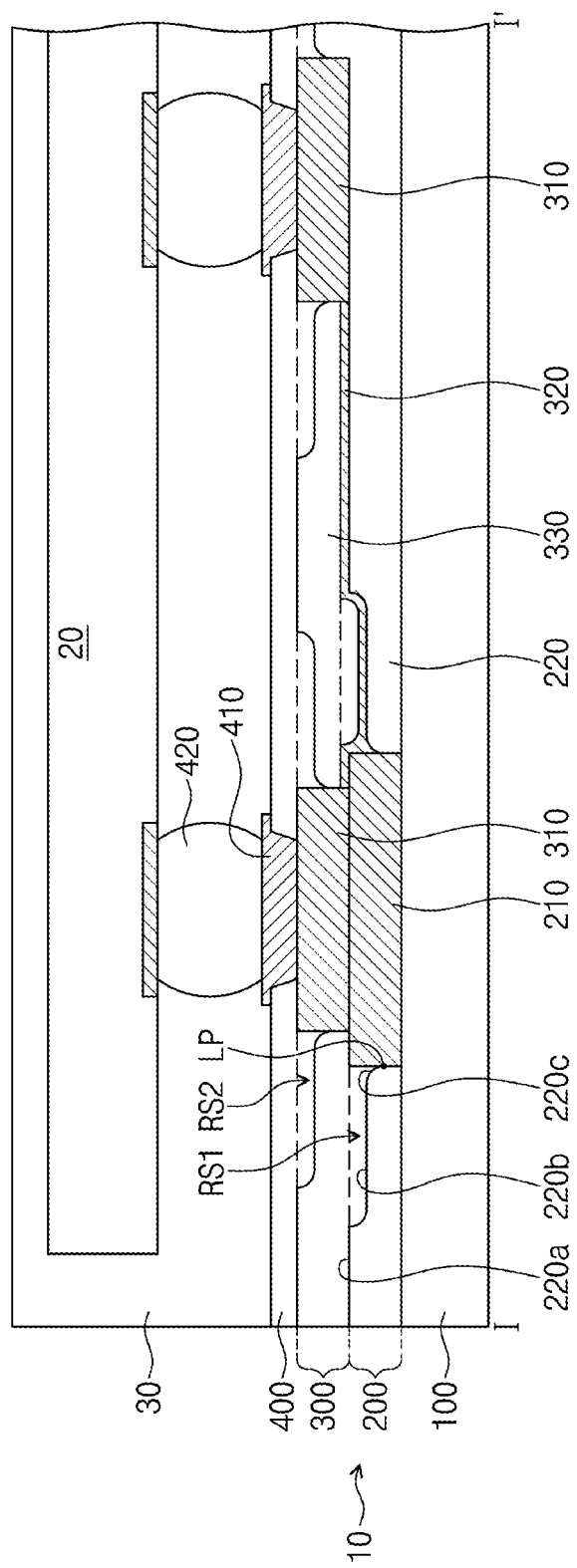
FIG. 4 illustrates a cross-sectional view of a redistribution substrate of a semiconductor package according to example embodiments of the present inventive concept.

In example embodiments, the first inclined surface 220c of the first insulating layer 220 may be inclined with the second upper surface 220b. FIG. 4 illustrates a cross-sectional view of a redistribution substrate of a semiconductor package according to example embodiments of the present inventive concept. As shown in FIG. 4, a distance between the first inclined surface 220c and the lower protective layer 100 may decrease as a distance from the second upper surface 220b increases. In detail, the distance between the lowest point LP of the first inclined surface 220c and the lower protective layer 100 may be shorter than the distance between the second upper surface 220b of the first insulating layer 220 and the lower protective layer 100. That is, the first inclined surface 220c may be a surface extending downward from the second upper surface 220b. The first inclined surface 220c may extend from the second upper surface 220b toward the lower protective layer 100 as illustrated in FIG. 4. The distance from the lower protective layer 100 to the lowest point LP of the first inclined surface 220c may be, for example, 0.5 to 1 times the distance from the lower protective layer 100 to the first upper surface 220a. Hereinafter, the description will be continued referring back to FIGS. 1, 2A and 2B.

Referring back to FIGS. 1, 2A and 2B, a second wiring layer 300 may be disposed on the first wiring layer 200. The second wiring layer 300 may include a second conductive pattern 310, a third conductive pattern 320, and a second insulating layer 330.

The second conductive pattern 310 and the third conductive pattern 320 may be disposed on the first wiring layer 200. In detail, the second conductive pattern 310 may be disposed on the first conductive pattern 210. The third conductive pattern 320 may be disposed on the first insulating layer 220. The second conductive pattern 310 and the third conductive pattern 320 may include various components constituting an electrical circuit in the second wiring layer 300. For example, the second conductive pattern 310 may be a conductive pad connected to the first conductive pattern 210 of the first wiring layer 200, and the third conductive pattern 320 may be a conductive wiring extending from the upper surface 210a of the first conductive pattern 210 to the upper surface of the first insulating layer 220 to constitute an electric circuit. In some embodiments, the second conductive pattern 310 may include a passive element, such as a capacitor or a resistance element, similarly to the first conductive pattern 210 described above. The second conductive pattern 310 may be provided in plural. As shown in FIG. 2B, one of the second conductive patterns 310 may be connected to the first conductive pattern 210, and the other one of the second conductive patterns 310 may be provided on the first insulating layer 220. The second conductive pattern 310 may be electrically connected by the third conductive pattern 320. The third conductive pattern 320 may extend along the top surface of the first insulating layer 220.

The third conductive pattern 320 extends from the top surface 210a of the first conductive pattern 210 along the bottom surface 220b of the first recess RS1 of the first insulating layer 220. The third conductive pattern 320 may extend from the first recess RS1 onto the first upper surface 220a. The thickness of the third conductive pattern 320 may be thinner than the thickness of the second conductive pattern 310. Each of the second conductive pattern 310 and the third conductive pattern 320 may include a conductive material. For example, each of the second conductive pattern 310 and the third conductive pattern 320 may include independently copper (Cu), a copper alloy, and/or aluminum (Al). In some embodiments, the second conductive pattern 310 and the third conductive pattern 320 may include different conductive materials.

The second insulating layer 330 may be disposed on the first insulating layer 220. The second insulating layer 330 may cover the first insulating layer 220 and the first conductive pattern 210. In this case, the second insulating layer 330 may fill the first recess RS1 of the first insulating layer 220. That is, the second insulating layer 330 may be in contact with the first upper surface 220a and the second upper surface 220b of the first insulating layer 220. The second insulating layer 330 may surround the second conductive pattern 310. The second insulating layer 330 may cover the third conductive pattern 320. The second insulating layer 330 may be in contact with the side surface 310b of the second conductive pattern 310. The second insulating layer 330 may include an insulating material. It will be understood that "an element A covers an element B" (or similar language) means that the element A extends on the element B but does not necessarily mean that the element A covers the element B entirely. It will be also understood that "an element A fills an element B" (or similar language) as used herein means that the element A is in the element B but does not necessarily mean that the element A fills the element B entirely.

For example, the second insulating layer 330 may include a dry film resist (DFR) and/or a photo imagable dielectric (PID). The second insulating layer 330 may include a third upper surface 330a surrounding the second conductive pattern 310, a fourth upper surface 330b disposed between the second conductive pattern 310 and the third upper surface 330a, and a second inclined surface 330c extending from the fourth upper surface 330b toward the side surface 310b of the second conductive pattern 310.

The third upper surface 330a may be substantially flat. The third upper surface 330a may be parallel to the upper surface of the lower protective layer 100. The third upper surface 330a may be positioned at the same level as the upper surface 310a of the second conductive pattern 310. In some embodiments, similarly to the first upper surface 220a of the first insulating layer 220, the third upper surface 330a may be located at a level higher or lower than the upper surface 310a of the second conductive pattern 310.

The fourth upper surface 330b may be located at a lower level than the third upper surface 330a. For example, the second insulating layer 330 may include a second recess RS2 that is recessed toward the lower protective layer 100 from the third upper surface 330a. The lowest point of the second recess RS2 may be lower than the third upper surface 330a. The second recess RS2 may be located between the second conductive pattern 310 and the third upper surface 330a of the second insulating layer 330.

The second inclined surface 330c may extend from one end of the fourth upper surface 330b to the side surface 310b of the second conductive pattern 310. The second inclined surface 330c may be inclined with the fourth upper surface 330b. According to FIG. 1, the second inclined surface 330c may be the second side 330c of the second recess RS2 which extends from the bottom surface 330b of the second recess RS2 toward the side surface 310b of the second conductive pattern 310. The distance between the second side surface 330c and the lower protective layer 100 may increase from the fourth upper surface 330b to the second conductive pattern 310. In some embodiments, the distance between the second side surface 330c and the lower protective layer 100 may increase as a distance from the fourth upper surface 330b increases as illustrated in FIGS. 3A through 3C.

The second inclined surface 330c may be a surface extending in a diagonally upward direction from the bottom surface 330b of the second recess RS2. The uppermost point of the second side surface 330c of the second recess RS2 may contact the upper surface 310a of the second conductive pattern 310. In some embodiments, the uppermost point of the second side surface 330c of the second recess RS2 may be directly connected to the upper surface 310a of the second conductive pattern 310. In some embodiments, the uppermost point of the second side surface 330c of the second recess RS2 may be located at a level lower than the top surface 310a of the second conductive pattern 310.

The upper protective layer 400 may be disposed on the second wiring layer 300. The upper protective layer 400 may cover the second insulating layer 330 and the second conductive pattern 310. In this case, the upper protective layer 400 may fill the second recess RS2 of the second insulating layer 330. That is, the upper protective layer 400 may contact the third upper surface 330a and the fourth upper surface 330b of the second insulating layer 330. The upper surface of the upper protective layer 400 may be substantially flat. The upper protective layer 400 may protect the first wiring layer 200 and the second wiring layer 300 of the redistribution substrate 10. The upper protective layer 400 may include an insulating material. For example, the upper protective layer 400 may include, but is not limited to, inorganic materials such as silicon oxide (SiOx), silicon nitride (SiNx), silicon oxynitride (SiON) and/or polyamide-based polymer materials.

The terminal pad 410 may be disposed on the upper protective layer 400. The terminal pad 410 may be connected to the second conductive pattern 310 and may extend through the upper protective layer 400. The terminal pad 410 may include a conductive material such as metal. Configuration of the redistribution substrate 10 of the semiconductor package is as described above.

The connection terminal 420 may be disposed on the redistribution substrate 10. For example, the connection terminal 420 may be disposed on the terminal pad 410. The connection terminal 420 may be a chip terminal of a semiconductor chip mounted on the redistribution substrate 10 or an external terminal for mounting the redistribution substrate 10 on another substrate. The connection terminal 420 may include a solder ball, a solder bump, or the like.

The external terminal 120 may be disposed under the redistribution substrate 10. For example, the substrate pad 110 may be disposed on the bottom surface of the lower protective layer 100 of the redistribution substrate 10. The substrate pad 110 may be connected to the first conductive pattern 210 of the first wiring layer 200 and may extend through the lower protective layer 100. The external terminal 120 may be disposed on the substrate pad 110. The external terminal 120 may be electrically connected to the first wiring layer 200 and the second wiring layer 300 through the substrate pad 110.

The semiconductor chip 20 may be mounted on the redistribution substrate 10. The lower surface of the semiconductor chip 20 facing the redistribution substrate 10 may be an active surface. The semiconductor chip 20 may be mounted on the redistribution substrate 10 in a flip chip manner. For example, the semiconductor chip 20 may be electrically connected to the redistribution substrate 10 through connection terminals 420 provided on the bottom surface of the semiconductor chip 20. The connection terminals 420 may be connected to the chip terminal (not shown) of the semiconductor chip 20 and the terminal pad 410 of the redistribution substrate 10. The connection terminals 420 may include solder balls or solder bumps. The semiconductor chip 20 may be electrically connected to the second conductive pattern 310 through the connection terminal 420 and the terminal pad 410. The redistribution substrate 10 may electrically connect the semiconductor chip 20 using the first wiring layer 200 and the second wiring layer 300. The semiconductor chip 20 may include silicon (Si).

The molding layer 30 may be provided on the redistribution substrate 10. The molding layer 30 may cover the semiconductor chip 20 on the upper surface of the redistribution substrate 10. For example, the molding layer 30 may cover the top and side surfaces of the semiconductor chip 20. The molding layer 30 may fill a space between the semiconductor chip 20 and the redistribution substrate 10. The molding layer 30 may include, for example, an insulating material such as an epoxy polymer. In some embodiments, the space between the semiconductor chip 20 and the redistribution substrate 10 may be filled with an under fill member.

Figure 5B:
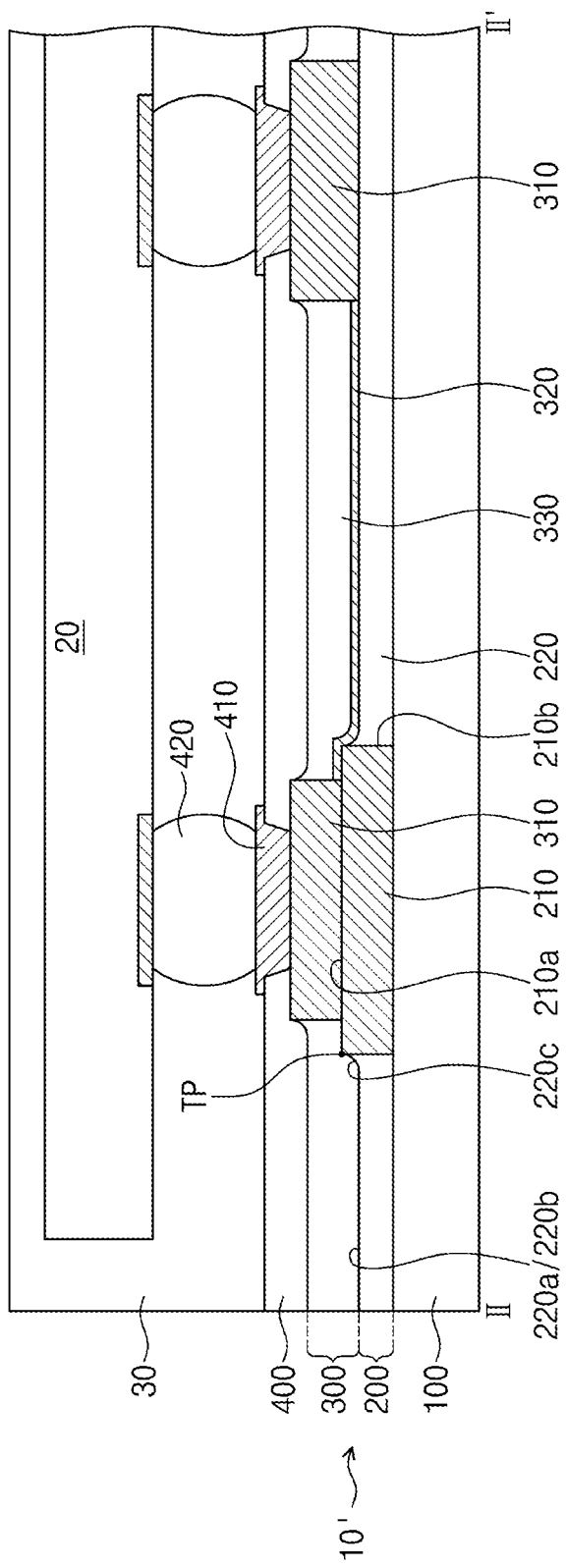
FIGS. 5B and 5C illustrate cross-sectional views of a redistribution substrate of a semiconductor package according to example embodiments of the present inventive concept.
Figure 5C:
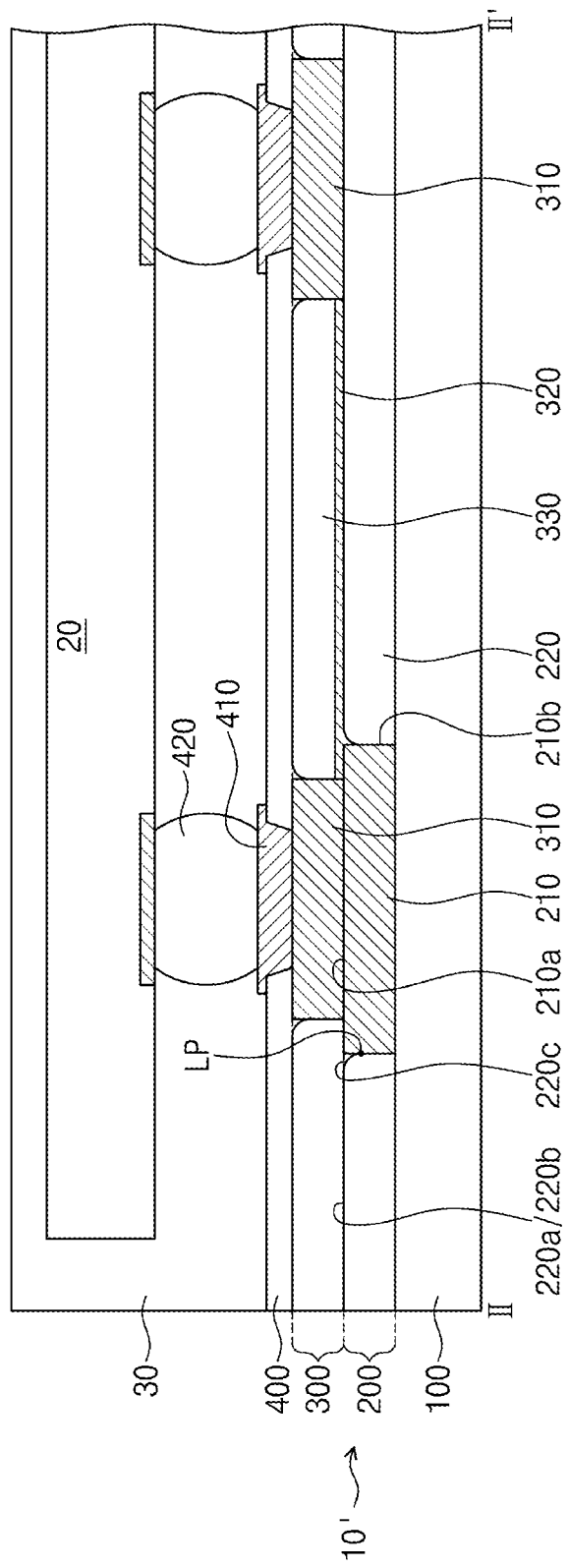

FIG. 5A is a plan view illustrating a redistribution substrate of a semiconductor package according to example embodiments of the present inventive concept, schematically illustrating a redistribution substrate of the semiconductor package of FIG. 1, and some components may not be shown for convenience of description. FIGS. 5B and 5C illustrate cross-sectional views of a redistribution substrate of a semiconductor package according to example embodiments of the present inventive concept and correspond to cross sections taken along the line II-IP of FIG. 5A. For convenience of description, in the following embodiments, the components described in the embodiments of FIGS. 2A and 2B may be referred to using the same reference numerals, and descriptions thereof may be omitted or briefly described for convenience of description. That is, the following description will focus on differences from the redistribution substrate of FIGS. 2A and 2B.

Referring to FIGS. 5A and 5B, the first upper surface 220a and the second upper surface 220b of the first insulating layer 220 may be positioned at the same level. The first upper surface 220a and the second upper surface 220b may be coplanar and may be substantially flat. That is, the first upper surface 220a and the second upper surface 220b may form one surface. Hereinafter, the entirety of the first upper surface 220a and the second upper surface 220b will be referred to as a single upper surface 220a/220b. The single upper surface 220a/220b may be located at a level lower than the top surface 210a of the first conductive pattern 210. The distance from the lower protective layer 100 to the single upper surface 220a/220b may be, for example, 0.5 to 1 times the distance from the lower protective layer 100 to the upper surface 210a of the first conductive pattern 210.

The first inclined surface 220c may extend from one end of the single upper surface 220a/220b to the side surface 210b of the first conductive pattern 210. The first inclined surface 220c may be located between the first conductive pattern 210 and the single upper surface 220a/220b. For example, as illustrated in FIG. 5A, the first inclined surface 220c may be formed on a portion of the first insulating layer 220 adjacent to the first conductive pattern 210 in a plan view, and the first inclined surface 220c may surround the first conductive pattern 210. The first inclined surface 220c may be positioned within the one upper surface 220a/220b in a plan view, and may surround the first conductive pattern 210. That is, the first inclined surface 220c may separate the first conductive pattern 210 from the one upper surface 220a/220b of the first insulating layer 220.

The first inclined surface 220c may be inclined with the single upper surface 220a/220b. The distance between the inclined surface 220c and the lower protective layer 100 may increase from the single upper surface 220a/220b toward the first conductive pattern 210. In some embodiments, the distance between the inclined surface 220c and the lower protective layer 100 may increase as a distance from the single upper surface 220a/220b increases as illustrated in FIG. 5B. The uppermost point TP of the first inclined surface 220c may be positioned at the same level as the upper surface 210a of the first conductive pattern 210 or at a level lower than the upper surface 201a. That is, the first inclined surface 220c may be a surface extending diagonally upward from the single upper surface 220a/220b.

According to some embodiments, as illustrated in FIG. 5C, the first upper surface 220a and the second upper surface 220b of the first insulating layer 220 may be positioned at the same level. The first upper surface 220a and the second upper surface 220b may be coplanar and may be substantially flat. The first upper surface 220a and the second upper surface 220b may be positioned at the same level as the upper surface 210a of the first conductive pattern 210. In some embodiments, the first upper surface 220a and the second upper surface 220b may be located at a level higher or lower than the upper surface 210a of the first conductive pattern 210.

The first inclined surface 220c of the first insulating layer 220 may be inclined with the second upper surface 220b. The distance between the first inclined surface 220c and the lower protective layer 100 may decrease from the second upper surface 220b toward the first conductive pattern 210. In some embodiments, the distance between the first inclined surface 220c and the lower protective layer 100 may decrease as a distance from the second upper surface 220b increases as illustrated in FIG. 5C. In detail, the distance between the lowest point LP of the first inclined surface 220c and the lower protective layer 100 may be shorter than or the same as the distance between the upper surface 210a of the first conductive pattern 210 and the lower protective layer 100. That is, the first inclined surface 220c may be a surface extending diagonally downward from the second upper surface 220b. The distance from the lower protective layer 100 to the lowest point LP of the first inclined surface 220c may be, for example, 0.5 to 1 times the distance from the lower protective layer 100 to the upper surface 210a of the first conductive pattern 210. The redistribution substrate 10' of the semiconductor package may be configured as described above with reference to FIGS. 5A through 5C.

The connection terminal 420 may be disposed on the redistribution substrate 10'. An external terminal (e.g., the external terminal 120 in FIG. 1) may be disposed under the redistribution substrate 10'. The semiconductor chip 20 may be mounted on the redistribution substrate 10'. The semiconductor chip 20 may be electrically connected to the redistribution substrate 10' through connection terminals 420 provided on the bottom surface of the semiconductor chip 20. The molding layer 30 may be provided on the redistribution substrate 10'. The molding layer 30 may cover the semiconductor chip 20 on the upper surface of the redistribution substrate 10'.

FIGS. 6 to 11 illustrate cross-sectional views illustrating a method of manufacturing a semiconductor package in accordance with embodiments of the present inventive concept.

Referring to FIG. 6, a lower protective layer 100 may be provided. The lower protective layer 100 may include a first region RG1, a second region RG2 surrounding the first region RG1, and a third region RG3 disposed between the first region RG1 and the second region RG2. The first region RG1 may be a region in which the first conductive pattern 210 of the first wiring layer 200 (e.g., the first wiring layer 200 in FIG. 1) is formed, and the second region RG2 and the third region RG3 each may be a region in which the first insulating layer 220 (e.g., the first insulating layer 220 in FIG. 1) of the first wiring layer 200 is formed.

The first wiring layer 200 including the first insulating layer 220 and the first conductive pattern 210 may be formed on the lower protective layer 100. Hereinafter, the process of forming the first wiring layer will be described in detail with reference to FIGS. 6 and 7.

Referring to FIG. 6, a first conductive pattern 210 may be formed on the first region RG1 of the lower protective layer 100. For example, after forming a seed layer on the lower protective layer 100, a mask may be formed on the seed layer to expose the first region RG1. Thereafter, the first conductive pattern 210 may be formed by filling a conductive material in the pattern of the mask through a plating process or the like. In some embodiments, after the conductive film is formed on the lower protective layer 100, the first conductive pattern 210 may be formed by patterning the conductive film.

The first insulating film 222 may be formed on the lower protective layer 100. For example, the first insulating film 222 may be formed by coating or depositing an insulating material on the lower protective layer 100. The coating process of the insulating material may include a spin coating process or a roll coating process. The insulating material may include a photosensitive insulating material. For example, the insulating material may include a dry film resist (DFR) and/or a photo imagable dielectric (PID).

The thickness of the first insulating film 222 may be the same as the thickness of the first insulating layer 220 (e.g., the first insulating layer 220 in FIG. 7) to be formed later. The first insulating film 222 may cover the first conductive pattern 210. Due to the thickness of the first conductive pattern 210 positioned on the upper surface of the lower protective layer 100, the first insulating film 222 disposed on the lower protective layer 100 and the first conductive pattern 210 may be lifted up in the third region RG3 adjacent to the first conductive pattern 210.

The upper surface of the first insulating film 222 in the third region RG3 may gradually rise from the second region RG2 toward the first region RG1. The first insulating film 222 may protrude upward in the first region RG1 and the third region RG3 adjacent to the first region RG1. The height of the upper surface of the first insulating film 222 on the first region RG1 and the third region RG3 may be higher than the height of the upper surface of the first insulating film 222 on the second region RG2. The height of the upper surface of the first insulating film 222 on the second region RG2 may be the same as the height of the upper surface of the first conductive pattern 210. In some embodiments, the upper surface of the first insulating film 222 on the second region RG2 and the upper surface of the first conductive pattern 210 may be coplanar with each other, and the upper surface of the first insulating film 222 on the first region RG1 and the third region RG3 may be higher than the upper surface of the first insulating film 222 on the second region RG2 as illustrated in FIG. 6.

Figure 7:
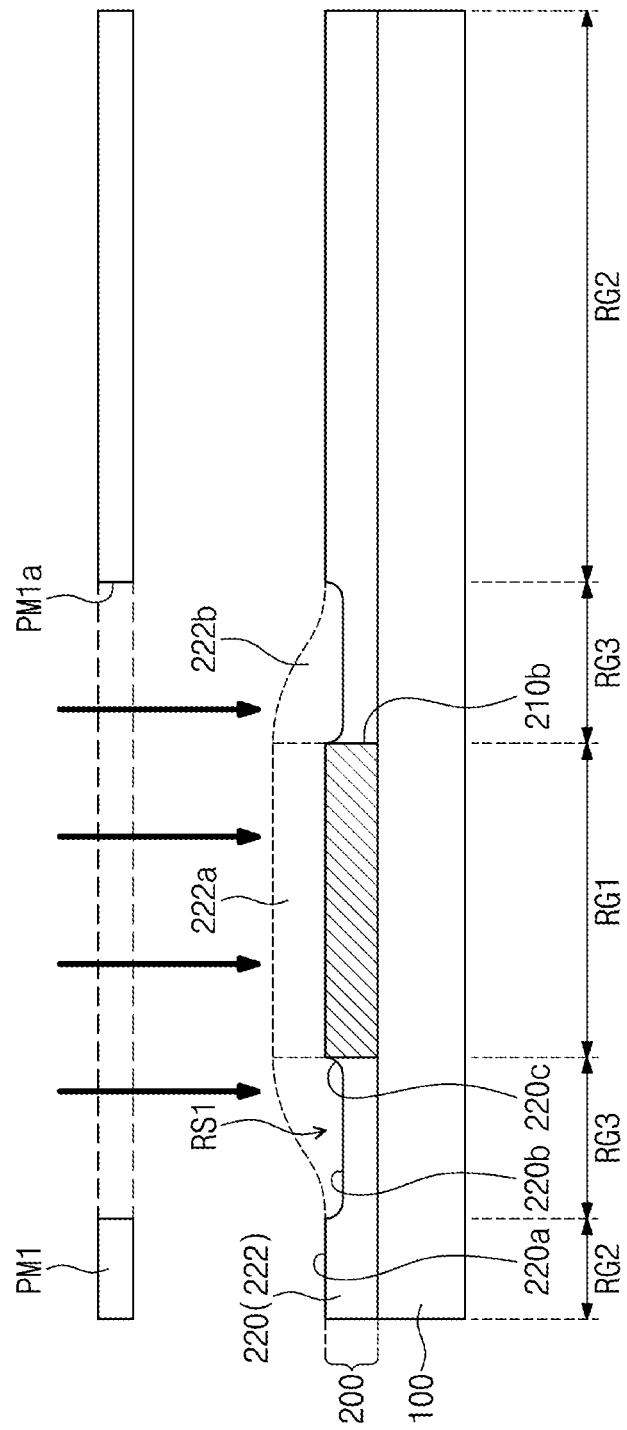

Referring to FIG. 7, a first photo mask PM1 may be provided over the first insulating film 222. The first photo mask PM1 may be spaced apart from the first insulating film 222. The pattern PM1a of the first photo mask PM1 may expose the first region RG1 and the third region RG3 of the lower protective layer 100. That is, a region exposed by the first photo mask PM1 may be a portion of the first insulating film 222 and a region in which the first conductive pattern 210 is in. The first photo mask PM1 may include a phase shift mask (PSM). For example, in the first photo mask PM1, a chromium (Cr) pattern may be formed on a quartz substrate, and a phase shifter is disposed between the quartz substrate and the chromium pattern. Accordingly, the resolution of the first photo mask PM1 may be enhanced.

A portion of the first insulating film 222 may be removed to form the first insulating layer 220. In particular, a portion of the first insulating film 222 in the first region RG1 and the third region RG3 may be removed. For example, an exposure process may be performed on the first insulating film 222 using the first photo mask PM1. A portion 222a of the first insulating film 222 may be removed from the first region RG1 by the exposure process to expose the first conductive pattern 210. In addition, a portion 222b of the first insulating film 222 may be removed from the third region RG3 by the exposure process to form a first recess RS1 on the first insulating film 222. The first recess RS1 may have a shape recessed from the upper surface 220a of the first insulating film 222 on the first region RG1 toward the lower protective layer 100.

In this case, the depth of the first recess RS1 formed by removing the first insulating film 222 may be shallow in a region adjacent to the side surface 210b of the first conductive pattern 210 due to variation or error of the exposure process. In particular, the depth toward which the first insulating film 222 is removed may be shallower toward the first conductive pattern 210. Accordingly, the first side surface 220c of the first recess RS1 may be formed to be inclined with respect to the bottom surface 220b of the first recess RS1 and the side surface 210b of the first conductive pattern 210. In addition, due to the process variation or error of the exposure process, the first insulating film 222 increases toward the outside of the pattern PM1a of the first photo mask PM1 (that is, closer to the second region RG2). The depth removed can be shallow. Accordingly, the first recess RS1 may not extend through the first insulating film 222. In some embodiments, the first recess RS1 may have a shape illustrated in FIG. 7.

As described above, the first wiring layer 200 having the first insulating layer 220 and the first conductive pattern 210 may be formed on the lower protective layer 100.

In example embodiments, the exposure process may be performed over the entire surface of the first insulating film 222. That is, the exposure process may be performed on the first insulating film 222 on the first region RG1, the second region RG2, and the third region RG3. The first conductive pattern 210 may be exposed on the first region RG1 by the exposure process, and the upper surface of the first insulating film 222 formed on the second region RG2 and the third region RG3 may be lower than the upper surface 210a of the conductive pattern 210. In this case, the redistribution substrate according to the embodiment of FIGS. 5A to 5C may be formed.

Figure 8:
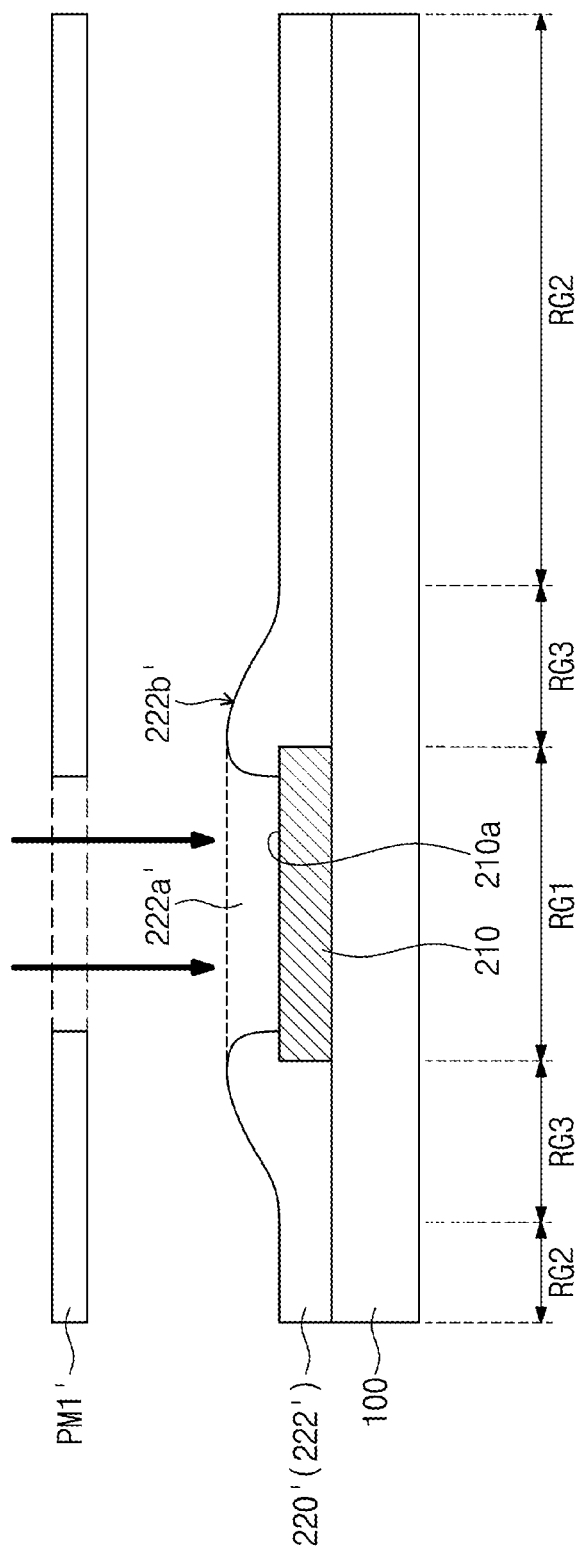

When the first insulating film 222 is removed only from the first region RG1, a protruding portion of the first insulating film 222 may remain. As illustrated in FIG. 8, a portion 222a' of the first insulating film 222' on the first region RG1 may be removed to expose the first conductive pattern 210. For example, an etching process may be performed on the first region RG1 and may not be performed on the second region RG2 and the third region RG3.

Accordingly, a portion 222b' of the first insulating film 222' protruding upward on the third region RG3 may remain. The portion 222b' of the protruding first insulating film 222' may have an uppermost end positioned at a level higher than an upper surface 210a of the first conductive pattern 210. In addition, the portion 222b' of the first insulating film 222' may have an uppermost end positioned at a level higher than an upper surface of the first insulating film 222' on the second region RG2. Accordingly, the first insulating film 222' may have a large step with the first conductive pattern 210. Due to this, a cavity such as an air gap may be formed in a deposition process subsequently performed, or impurities may be generated on the first insulating film 222' and the first conductive pattern 210, which may cause a defect at the redistribution substrate.

According to example embodiments of the present inventive concept, the portion 222b' of the first insulating film 222' may be removed. During the patterning process of the first insulating film 222', an exposure process may be performed on both the first region RG1 and the third region RG3, and the height of the upper surface of the first insulating film 222 may be the same as or lower than the first conductive pattern 210. That is, the step between the first conductive pattern 210 and the first insulating layer 220 may be small, and the occurrence of defects may be reduced during the subsequent deposition process described later.

The second wiring layer 300 including the second conductive pattern 310 and the second insulating layer 330 may be formed on the first wiring layer 200. The process of forming the second wiring layer 300 may be the same as or similar to the process of forming the first wiring layer 200.

Figure 9:
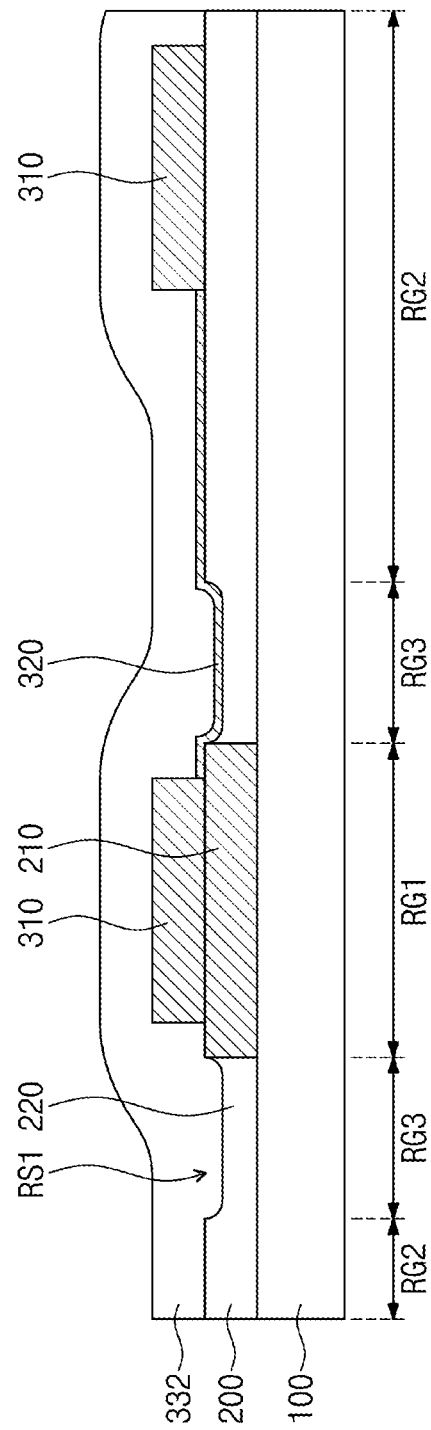

Referring to FIG. 9, a second conductive pattern 310 and a third conductive pattern 320 may be formed on the first wiring layer 200. For example, after forming a seed layer on the first wiring layer 200, a mask exposing a portion of the seed layer formed on the first conductive pattern 210 or the first insulating layer 220 may be formed. Thereafter, the second conductive pattern 310 may be formed by filling a conductive material in the pattern of the mask using a plating process or the like. For example, after the conductive film is formed on the first wiring layer 200, the third conductive pattern 320 may be formed by patterning the conductive film.

In this case, the conductive film may be formed to conformally cover the upper surface of the first insulating layer 220. Accordingly, the third conductive pattern 320 may be formed to extend from the first surface of the first conductive pattern 210 to the upper surface of the insulating layer 220. In detail, the third conductive pattern 320 may be formed along the bottom surface of the first recess RS1 of the first insulating layer 220 on the third region RG3. In this case, since the step difference between the first conductive pattern 210 and the first insulating layer 220 is small, no air gap or impurities may be formed, for example, under the third conductive pattern 320 adjacent an interface between the first conductive pattern 210 and the first insulating layer 220, when the conductive film is formed. The thickness of the third conductive pattern 320 may be smaller than the thickness of the second conductive pattern 310. In some embodiments, the third conductive pattern 320 may directly contact surfaces of the first insulating layer 220 and the first recess RS1 and may have a uniform thickness along these surfaces of the first insulating layer 220 and the first recess RS1 as illustrated in FIG. 9. As used herein "a step difference between an element A and an element B" (or similar language) may refer to a height difference between the element A and the element B.

The second insulating film 332 may be formed on the first wiring layer 200. For example, the second insulating film 332 may be formed by coating or depositing an insulating material on the first wiring layer 200. The coating process of the insulating material may include a spin coating process or a roll coating process. The insulating material may include a photosensitive insulating material. For example, the insulating material may include a dry film resist (DFR) and/or a photo imagable dielectric (PID). In this case, the insulating material may fill the first recess RS1 of the first insulating layer 220. That is, the second insulating film 332 may be in contact with the top surface of the first insulating layer 220, the bottom surface and the side surface of the first recess RS1.

At this time, since the step difference between the first conductive pattern 210 and the first insulating layer 220 is small, an air gap or impurities may not be formed, for example, under the second insulating film 332 adjacent an interface between the first conductive pattern 210 and the first insulating layer 220, when the insulating material is coated. The second insulating film 332 may cover the second conductive pattern 310 and the third conductive pattern 320. Due to the thickness of the second conductive pattern 310 positioned on the upper surface of the first wiring layer 200, the second insulating film 332 coated on the first wiring layer 200 and the second conductive pattern 310 may be lifted up in an area adjacent to the second conductive pattern 310. The second insulating film 332 may protrude upward from the second conductive pattern 310.

Figure 10:
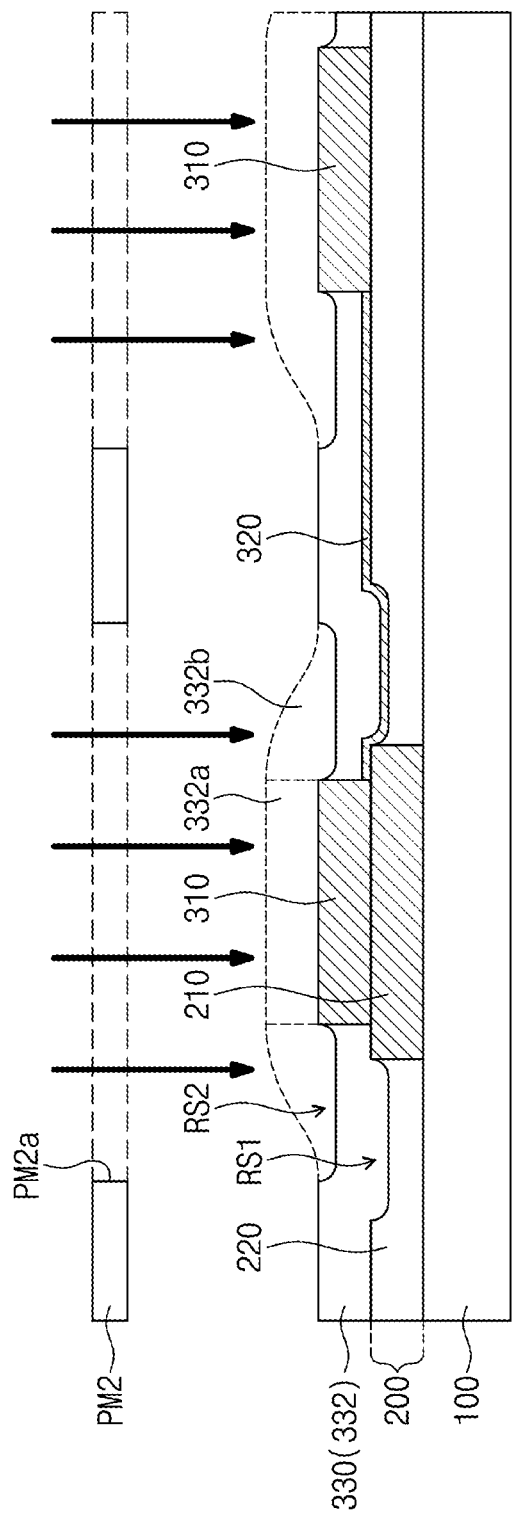

Referring to FIG. 10, a portion of the second insulating film 332 may be removed to form the second insulating layer 330. The process of forming the second insulating layer 330 may be the same as or similar to the process of forming the first insulating layer 220. For example, a second photo mask PM2 may be provided over the second insulating layer 332. The pattern PM2a of the second photo mask PM2 may expose the second conductive pattern 310 and a portion of the second insulating layer 332 adjacent to the second conductive pattern 310.

An exposure process may be performed on the second insulating layer 332 using the second photo mask PM2. In particular, the portion 332a of the second insulating layer 332 protruding upward on the second conductive pattern 310 may be removed. A portion 332a of the second insulating layer 332 may be removed by the exposure process to expose the second conductive pattern 310. In addition, a portion 332b of the second insulating layer 332 adjacent to the second conductive pattern 310 may be removed by the exposure process to form a second recess RS2 on the second insulating layer 332.

According to example embodiments of the present inventive concept, the protruding portion of the second insulating layer 332 may be removed. During the patterning process of the second insulating layer 332, an exposure process may be performed on both the second conductive pattern 310 and the region adjacent to the second conductive pattern 310, and the height of the upper surface of the second insulating layer 332 may be equal to or lower than the top surface of the second conductive pattern 310. That is, the step difference between the second conductive pattern 310 and the second insulating layer 332 may be small, and the occurrence of defects may be reduced in the deposition process described later. As described above, the second wiring layer 300 including the second insulating layer 330, the second conductive pattern 310, and the third conductive pattern 320 may be formed on the first wiring layer 200.

Figure 11:
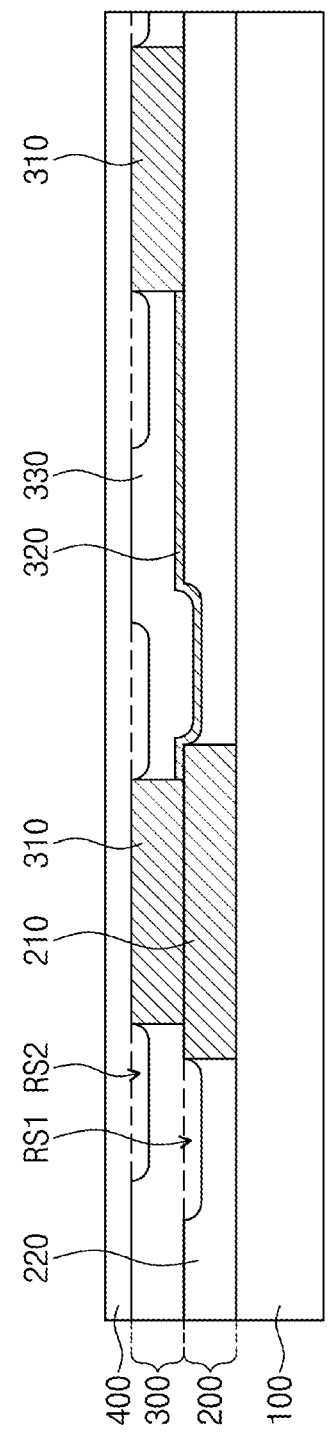

Referring to FIG. 11, an upper protective layer 400 may be formed on the second wiring layer 300. For example, the upper protective layer 400 may be formed by depositing or coating an insulating material on the second wiring layer 300. For example, the insulating material may include, but is not limited to, inorganic materials such as silicon oxide (SiOx), silicon nitride (SiNx), silicon oxynitride (SiON) and/or polyamide-based polymer materials. In this case, the insulating material may fill the second recess RS2 of the second insulating layer 330. That is, the upper protective layer 400 may contact the upper surface of the second insulating layer 330, the bottom surface and the side surface of the second recess RS2. In this case, since the step difference between the second conductive pattern 310 and the second insulating layer 330 is small, air gaps or impurities may not be formed, for example, under the upper protective layer 400 adjacent to an interface between the second conductive pattern 310 and the second insulating layer 330, when the insulating material is coated.

Referring back to FIGS. 1, 2A, and 2B, a terminal pad 410 and a connection terminal 420 may be formed on the redistribution substrate 10. The terminal pad 410 may be formed on the upper protective layer 400. For example, a through hole may be formed by performing an etching process on the upper protective layer 400. The through hole may expose the top surface of the second conductive pattern 310. Thereafter, a terminal pad 410 may be formed by filling a conductive material in the through hole.

The connection terminal 420 may be provided on the terminal pad 410. The connection terminal 420 may include a solder ball, a solder bump, or the like.

The semiconductor chip 20 may be mounted on the redistribution substrate 10. The semiconductor chip 20 may be mounted, for example, in a flip chip manner. For example, the semiconductor chip 20 may be mounted on the redistribution substrate 10 through the connection terminal 420.

The molding layer 30 may be formed on the redistribution substrate 10. For example, after the molding material is coated on the redistribution substrate 10 to cover the semiconductor chip 20, the molding material may be cured to form the molding layer 30.

In the method of manufacturing the semiconductor package according to the embodiments of the present inventive concept, a step or a height difference between the first conductive pattern and the first insulating layer may be small, and the occurrence of defects may be reduced during a subsequent deposition process. Accordingly, the manufacturing method of the semiconductor package may produce the semiconductor package that is more reliable and include fewer defects.

Various and advantageous advantages and effects of the present inventive concept are not limited to the above description. Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the scope of the present inventive concept as set forth in the following claims.

What is claimed is:

1. A semiconductor package comprising:
   a redistribution substrate; and
   a semiconductor chip on the redistribution substrate,
   wherein the redistribution substrate includes:
      a lower protective layer;
      a first conductive pattern on the lower protective layer;
      a first insulating layer surrounding the first conductive pattern and on the lower protective layer, the first insulating layer including a first upper surface that includes a first flat portion extending parallel to an upper surface of the lower protective layer and a first recess, and the first insulating layer contacting a side surface of the first conductive pattern, wherein the side surface of the first conductive pattern extends between an upper surface and a lower surface of the first conductive pattern; and
      a second insulating layer on the first insulating layer,
      wherein the first recess is closer than the first flat portion to the upper surface of the first conductive pattern,
      the first recess is recessed toward the lower protective layer with respect to both the upper surface of the first conductive pattern and the first flat portion of the first upper surface of the first insulating layer, and
      the first flat portion of the first upper surface of the first insulating layer is coplanar with the upper surface of the first conductive pattern.

2. The semiconductor package of claim 1, wherein the second insulating layer is in contact with the first upper surface of the first insulating layer, and a portion of the second insulating layer is in the first recess of the first insulating layer.

3. The semiconductor package of claim 1, wherein the first recess includes a side surface that is directly connected to the first conductive pattern and is inclined with respect to the upper surface of the lower protective layer,
   a distance between a first portion of the side surface of the first recess and the side surface of the first conductive pattern is longer than a distance between a second portion of the side surface of the first recess and the side surface of the first conductive pattern, and
   a distance from the upper surface of the lower protective layer to the first portion of the side surface of the first recess is shorter than a distance from the upper surface of the lower protective layer to the second portion of the side surface.

4. The semiconductor package of claim 1, wherein the first recess includes a side surface and a lower surface, and the side surface of the first recess is directly connected to the first conductive pattern and is between the first conductive pattern and the lower surface of the first recess, and
   a distance from the upper surface of the lower protective layer to the lower surface of the first recess is 0.7 to 0.9 times a distance from the upper surface of the lower protective layer to the first flat portion of the first upper surface of the first insulating layer.

5. The semiconductor package of claim 1, further comprising a second conductive pattern on the first conductive pattern,
   wherein the second insulating layer includes a second upper surface that includes a second flat portion extending parallel to the upper surface of the lower protective layer, and
   the second upper surface of the second insulating layer further includes a second recess that is between the second flat portion of the second upper surface of the second insulating layer and the second conductive pattern.

6. The semiconductor package of claim 1, further comprising:
   a second conductive pattern on the first conductive pattern; and
   a terminal pad that is on the second insulating layer and electrically connects the second conductive pattern to the semiconductor chip.

7. The semiconductor package of claim 1, wherein the first recess of the first upper surface of the first insulating layer surrounds the first conductive pattern in a plan view.

8. The semiconductor package of claim 1, wherein the lower surface of the first conductive pattern and a lower surface of the first insulating layer are coplanar with each other.

9. A semiconductor package comprising:
a lower protective layer;
a first conductive pattern on the lower protective layer;
a first insulating layer on the lower protective layer and contacting a side surface of the first conductive pattern, wherein the side surface of the first conductive pattern extends between an upper surface and a lower surface of the first conductive pattern;
a second insulating layer on the first insulating layer and the first conductive pattern; and
a semiconductor chip on the second insulating layer,
wherein the first insulating layer includes a first upper surface and an inclined surface adjacent to the side surface of the first conductive pattern,
the first upper surface of the first insulating layer extends parallel to an upper surface of the lower protective layer,
a distance from the upper surface of the lower protective layer to the first upper surface of the first insulating layer is equal to a distance from the upper surface of the lower protective layer to the upper surface of the first conductive pattern, and
a distance from the upper surface of the lower protective layer to a first portion of the inclined surface of the first insulating layer is different from a distance from the upper surface of the lower protective layer to a second portion of the inclined surface of the first insulating layer,
wherein the inclined surface of the first insulating layer is between the first conductive pattern and the first upper surface of the first insulating layer.

10. The semiconductor package of claim 9, wherein a distance between the first portion of the inclined surface and the side surface of the first conductive pattern is longer than a distance between the second portion of the inclined surface and the side surface of the first conductive pattern, and
the distance from the upper surface of the lower protective layer to the first portion of the inclined surface is shorter than the distance from the upper surface of the lower protective layer to the second portion of the inclined surface.

11. The semiconductor package of claim 9, wherein a distance between the first portion of the inclined surface and the side surface of the first conductive pattern is longer than a distance between the second portion of the inclined surface and the side surface of the first conductive pattern, and
the distance from the upper surface of the lower protective layer to the first portion of the inclined surface is longer than the distance from the upper surface of the lower protective layer to the second portion of the inclined surface.

12. The semiconductor package of claim 9, further comprising:
a second conductive pattern extending through the second insulating layer and contacting the first conductive pattern, wherein the second conductive pattern is electrically connected with the semiconductor chip; and
an upper protective layer on the second insulating layer and the second conductive pattern.

13. The semiconductor package of claim 9, wherein the first conductive pattern is between the semiconductor chip and the lower protective layer.

14. A semiconductor package comprising:
a redistribution substrate;
a semiconductor chip on the redistribution substrate; and
a molding film on the redistribution substrate and on a side surface of the semiconductor chip,
wherein the redistribution substrate includes:
a lower protective layer;
a first conductive pattern on the lower protective layer;
a first insulating layer on the lower protective layer and surrounding the first conductive pattern;
a second insulating layer on the first insulating layer and the first conductive pattern; and
a terminal pad on the second insulating layer and electrically connected to the semiconductor chip, and
wherein the first insulating layer includes an inclined surface, a first upper surface and a second upper surface,
the first upper surface is between the inclined surface and the second upper surface and extends parallel to an upper surface of the lower protective layer,
the second upper surface is coplanar with an upper surface of the first conductive pattern,
the lower protective layer, the first insulating layer, and the second insulating layer are stacked in a first direction,
a distance from the upper surface of the lower protective layer to the first upper surface in the first direction is shorter than a distance from the upper surface of the lower protective layer to the second upper surface in the first direction, and
a distance from the upper surface of the lower protective layer to a first portion of the inclined surface in the first direction is different from a distance from the upper surface of the lower protective layer to a second portion of the inclined surface in the first direction.

15. The semiconductor package of claim 14, wherein a distance between the first portion of the inclined surface and a side surface of the first conductive pattern in a second direction is longer than a distance between the second portion of the inclined surface and the side surface of the first conductive pattern in the second direction, and the second direction is perpendicular to the first direction, and
the distance from the upper surface of the lower protective layer to the first portion of the inclined surface in the first direction is shorter than the distance from the upper surface of the lower protective layer to the second portion of the inclined surface in the first direction.

16. The semiconductor package of claim 14, wherein a distance between the first portion of the inclined surface and a side surface of the first conductive pattern in the first direction is longer than a distance between the second portion of the inclined surface and the side surface of the first conductive pattern in the first direction, and
the distance from the upper surface of the lower protective layer to the first portion of the inclined surface in the first direction is greater than the distance from the upper surface of the lower protective layer to the second portion of the inclined surface in the first direction.

17. The semiconductor package of claim 14, further comprising:

a second conductive pattern extending from the upper surface of the first conductive pattern onto the first insulating layer and extending between the second insulating layer and the first insulating layer; and a third conductive pattern extending through the second insulating layer and electrically connected to the second conductive pattern.

18. The semiconductor package of claim 14, wherein the first insulating layer and the second insulating layer include a photosensitive insulating material.

* * * * *